(12) United States Patent
Allott et al.

(10) Patent No.: US 7,301,398 B1
(45) Date of Patent: Nov. 27, 2007

(54) HIGH LINEARITY DIFFERENTIAL TRANSCONDUCTANCE AMPLIFIER

(75) Inventors: Stephen Allott, Scotts Valley, CA (US); Mark Alexander John Moffat, Santa Cruz, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 74 days.

(21) Appl. No.: 11/384,459

(22) Filed: Mar. 20, 2006

(51) Int. Cl.
*H03F 3/45* (2006.01)
(52) U.S. Cl. .................................... 330/253; 330/254
(58) Field of Classification Search ................ 330/253, 330/254, 258, 261
See application file for complete search history.

(56) References Cited

U.S. PATENT DOCUMENTS 3,737,797 A * 6/1973 Amemiya ................ 330/261
6,100,758 A * 8/2000 Klemmer ................ 330/252
6,509,795 B1 * 1/2003 Ivanov .................... 330/253
7,245,181 B2 * 7/2007 Sanduleanu et al. ........ 330/253

* cited by examiner

*Primary Examiner*—Henry Choe
(74) *Attorney, Agent, or Firm*—Withrow & Terranova, PLLC (57) ABSTRACT

The present invention is a differential transconductance amplifier circuit that includes matched cross-coupled transconductance elements connected such that the differential gain of the amplifier is determined by only passive elements. By virtually eliminating the effects of active elements on the amplifier gain, the amplifier operates in a very linear manner over its entire operating range. Power consumption, amplifier noise level, and dynamic range can be optimized with appropriate selection of the passive elements that determine amplifier gain.

20 Claims, 5 Drawing Sheets

HIGH LINEARITY DIFFERENTIAL TRANSCONDUCTANCE AMPLIFIER

FIELD OF THE INVENTION

The present invention relates to differential amplifier circuits used in consumer, commercial, industrial, or military applications.

BACKGROUND OF THE INVENTION

Differential amplifiers are commonly used in consumer, commercial, industrial, or military electronic devices and may be used natively or to form operational amplifiers. Medical devices, analytical instrumentation, audio circuitry, wireless devices, and other devices often require linear, low noise amplification of input signals over a wide dynamic range using cost effective technology.

Portable, battery powered devices must be low powered. Input signals may be provided from high impedance sources thereby requiring amplifiers with high input impedances. There is a need for a low noise differential amplifier that is linear across a wide dynamic range of input signals with low power consumption, constructed using low cost, readily available technology that provides high input impedances.

SUMMARY OF THE INVENTION

The present invention is a differential transconductance amplifier circuit that includes matched cross-coupled transconductance elements connected such that the differential gain of the amplifier is determined by only passive elements. By virtually eliminating the effects of active elements on the amplifier gain, the amplifier operates in a very linear manner over its entire operating range. Power consumption, amplifier noise level, and dynamic range can be optimized with appropriate selection of the passive elements that determine amplifier gain.

Certain cross-coupled transconductance elements may be subject to transconductance mismatch, threshold voltage mismatch, or both, which may restrict the operating range of some implementations of the present invention. Transconductance mismatch, threshold voltage mismatch, or both, can cause latch-up of certain transconductance elements in some implementations of the present invention in the presence of large input signals; therefore, some embodiments of the present invention include bootstrap circuits to prevent latch-up, to extend the operating range, or both.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is a differential transconductance amplifier circuit, which includes matched cross-coupled transconductance elements that are connected such that the differential gain of the amplifier is determined by only passive elements. By virtually eliminating the effects of active elements on the amplifier gain, the amplifier operates in a very linear manner over its entire operating range. Power consumption, amplifier noise level, and dynamic range can be optimized with appropriate selection of the passive elements that determine amplifier gain. During normal operation the cross-coupled transconductance elements function in their linear operating ranges.

Each transconductance element includes a control input, a current input, and a current output. If a metal oxide semiconductor (MOS) transistor is used as a transconductance element, the gate of the MOS transistor serves as the control input, the source of the MOS transistor serves as the current input, and the drain of the MOS transistor serves as the current output of the transconductance element. The threshold voltage of the transconductance element is defined as the minimum voltage that must be applied between the control input and the current input for current to flow between the current input and the current output at a specified applied voltage. The transconductance of the transconductance element is defined as the relationship between the applied voltage between the control input and the current input and the resulting current flow between the current input and the current output at a specified applied voltage.

Certain transconductance elements may be subject to transconductance mismatch, threshold voltage mismatch, or both, which may restrict the operating range of some implementations of the present invention. Transconductance mismatch, threshold voltage mismatch, or both, can cause latch-up of certain transconductance elements in some implementations of the present invention in the presence of large input signals; therefore, some embodiments of the present invention include bootstrap circuits to prevent latch-up or to extend the operating range, or both.

Figure 1:
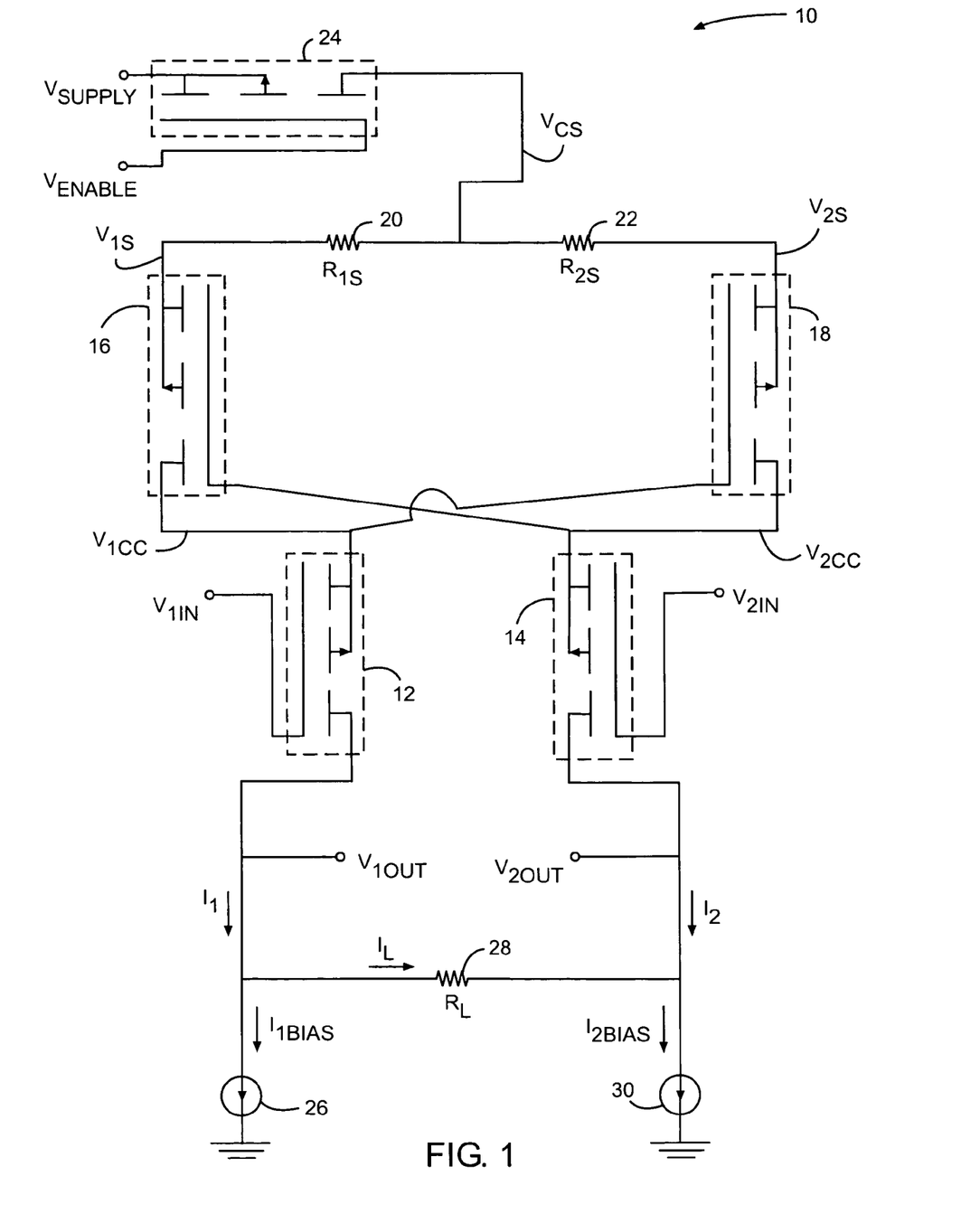
FIG. 1 shows one embodiment of the present invention using p-channel metal oxide semiconductor (PMOS) transistors as transconductance elements to form a differential transconductance amplifier.

One embodiment of the present invention uses PMOS transistors as transconductance elements to form a differential transconductance amplifier 10 as shown in FIG. 1. A first differential input $V_{1IN}$ is coupled to the gate of a first input transistor 12. A second differential input $V_{2IN}$ is coupled to the gate of a second input transistor 14. The differential transconductance amplifier's differential input voltage $V_{IN}$, is equal to the voltage at the first differential input $V_{1IN}$ minus the voltage at the second differential input $V_{2IN}$. The source of the first input transistor 12, the drain of a first cross-coupled transistor 16, and the gate of a second cross-coupled transistor 18 are connected at a node $V_{1CC}$. The source of the second input transistor 14, the drain of the second cross-coupled transistor 18, and the gate of the first cross-coupled transistor 16 are connected at a node $V_{2CC}$. The bulk nodes of the transistors 12,14,16,18 may be connected to their respective sources. The source of the first cross-coupled transistor 16 and a first source resistor ($R_{1S}$) 20 are connected at a node $V_{1S}$. The source of the second cross-coupled transistor 18 and a second source resistor ($R_{2S}$) 22 are connected at a node $V_{2S}$.

The first source resistor ($R_{1S}$) 20, the second source resistor ($R_{2S}$) 22, and the drain of an enable transistor 24 are connected at a node $V_{CS}$. The source of the enable transistor 24 is coupled to a DC supply $V_{SUPPLY}$. The gate of the enable transistor 24 is coupled to an enable input $V_{ENABLE}$. The enable transistor 24 functions as a current source to supply DC current to the differential transconductance amplifier 10 when the enable input $V_{ENABLE}$ is in its active state. The enable transistor 24 may generate a significant level of noise; however, since the enable transistor 24 supplies current to both sides of the differential transconductance amplifier 10, any generated noise will be common mode noise. Therefore, the noise will be rejected and not appear as part of the differential transconductance amplifier's differential output voltage $V_{OUT}$.

A first differential output $V_{1OUT}$ is coupled to the drain of the first input transistor 12, a first current source 26, and an output resistor ($R_L$) 28. A second differential output $V_{2OUT}$ is coupled to the drain of the second input transistor 14, a second current source 30, and the output resistor ($R_L$) 28. The differential output voltage $V_{OUT}$ is equal to the voltage at the first differential output $V_{1OUT}$ minus the voltage at the second differential output $V_{2OUT}$. The first and second current sources 26, 30 are coupled to ground. The current through the first current source 26 is $I_{1BIAS}$. The current through the second current source 30 is $I_{2BIAS}$.

The voltage gain of the differential transconductance amplifier 10 is defined as $V_{OUT}/V_{IN}$ and is derived below with the following assumptions. No current flows through the gates of the transistors 12,14,16,18. The transconductance of the transistors 12,14,16,18 is defined as the source-to-drain current divided by the source-to-gate voltage. The transconductance of the first input transistor 12 is $G_{1I}$. The transconductance of the second input transistor 14 is $G_{2I}$. The transconductance of the first cross-coupled transistor 16 is $G_{1CC}$. The transconductance of the second cross-coupled transistor 18 is $G_{2CC}$. Since no current flows though the gate of the first cross-coupled transistor 16 or the gate of the first input transistor 12, the current through the first source resistor ($R_{1S}$) 20 is $I_1$ and is equal to the source-to-drain current of the first cross-coupled transistor 16 and to the source-to-drain current of the first input transistor 12. Since no current flows though the gate of the second cross-coupled transistor 18 or the gate of the second input transistor 14, the current through the second source resistor ($R_{2S}$) 22 is $I_2$ and is equal to the source-to-drain current of the second cross-coupled transistor 18 and to the source-to-drain current of the second input transistor 14. The current through the output resistor ($R_L$) 28 is $I_L$.

With the above assumptions, the voltage gain of the differential transconductance amplifier 10 is shown in the following calculations.

$$G_{1I}=I_1/(V_{1CC}-V_{1IN}) \text{ or } I_1=G_{1I}(V_{1CC}-V_{1IN}) \qquad \text{Eq. 1}$$

$$G_{1CC}=I_1/(V_{1S}-V_{2CC}) \text{ or } I_1=G_{1CC}(V_{1S}-V_{2CC}) \qquad \text{Eq. 2}$$

Combining Eq. 1 and Eq. 2—

$$G_{1I}(V_{1CC}-V_{1IN})=G_{1CC}(V_{1S}-V_{2CC}) \qquad \text{Eq. 3}$$

The transconductance of the first input transistor 12 is matched to the transconductance of the first cross-coupled transistor 16; therefore, $$G_{1I}=G_{1CC}=G_1 \text{ therefore, Eq. 3 becomes} \qquad \text{Eq. 4}$$

$$G_1(V_{1CC}-V_{1IN})=G_1(V_{1S}-V_{2CC}) \text{ or} \qquad \text{Eq. 5}$$

$$V_{1CC}-V_{1IN}=V_{1S}-V_{2CC} \text{ or } V_{1IN}=V_{1CC}+V_{2CC}-V_{1S} \qquad \text{Eq. 6}$$

$$G_{2I}=I_2/(V_{2CC}-V_{2IN}) \text{ or } I_2=G_{2I}(V_{2CC}-V_{2IN}) \qquad \text{Eq. 7}$$

$$G_{2CC}=I_2/(V_{2S}-V_{1CC}) \text{ or } I_2=G_{2CC}(V_{2S}-V_{1CC}) \qquad \text{Eq. 8}$$

Combining Eq. 7 and Eq. 8—

$$G_{2I}(V_{2CC}-V_{2IN})=G_{2CC}(V_{2S}-V_{1CC}) \qquad \text{Eq. 9}$$

The transconductance of the second input transistor 14 is matched to the transconductance of the second cross-coupled transistor 18; therefore, $$G_{2I}=G_{2CC}=G_2 \text{ therefore, Eq. 9 becomes} \qquad \text{Eq. 10}$$

$$G_2(V_{2CC}-V_{2IN})=G_2(V_{2S}-V_{1CC}) \text{ or} \qquad \text{Eq. 11}$$

$$V_{2CC}-V_{2IN}=V_{2S}-V_{1CC} \text{ or } V_{2IN}=V_{2CC}+V_{1CC}-V_{2S} \qquad \text{Eq. 12}$$

Subtracting Eq. 12 from Eq. 6, $$V_{1IN}-V_{2IN}=V_{1CC}+V_{2CC}-V_{1S}-V_{2CC}-V_{1CC}+V_{2S} \text{ or} \qquad \text{Eq. 13}$$

$$V_{1IN}-V_{2IN}=V_{IN}=V_{2S}-V_{1S} \text{ however,} \qquad \text{Eq. 14}$$

$$V_{1S}=V_{CS}-I_1R_{1S} \text{ and} \qquad \text{Eq. 15}$$

$$V_{2S}=V_{CS}-I_2R_{2S} \qquad \text{Eq. 16}$$

The first source resistor ($R_{1S}$) 20 is essentially equal to the second source resistor ($R_{2S}$) 22; therefore, $$R_{1S}=R_{2S}=R_S \qquad \text{Eq. 17}$$

Substituting Eq. 17 into Eq. 15 and Eq. 16 and then substituting Eq. 15 and Eq. 16 into Eq. 14, $$V_{IN}=V_{CS}-I_2R_S-(V_{CS}-I_1R_S) \text{ or} \qquad \text{Eq. 18}$$

$$V_{IN}=(I_1-I_2)R_S \qquad \text{Eq. 19}$$

Using Kirchoff's current law, $$I_1=I_{1BIAS}+I_L \qquad \text{Eq. 20}$$

$$I_2=I_{2BIAS}-I_L \qquad \text{Eq. 21}$$

The first current source ($I_{1BIAS}$) 26 is essentially equal to the second current source ($I_{2BIAS}$) 30; therefore, $$I_{1BIAS}=I_{2BIAS}=I_{BIAS} \qquad \text{Eq. 22}$$

Substituting Eq. 22 into Eq. 20 and Eq. 21 and then subtracting Eq. 21 from Eq. 20, $$I_1-I_2=I_{BIAS}+I_L-(I_{BIAS}-I_L)2I_L \qquad \text{Eq. 23}$$

Substituting Eq. 23 into Eq. 19, $$V_{IN} = 2I_L R_S \quad \text{Eq. 24}$$

$$I_L = V_{OUT}/R_L \quad \text{Eq. 25}$$

Substituting Eq. 25 into Eq. 24, $$V_{IN} = 2V_{OUT} R_S/R_L \quad \text{Eq. 26}$$

Re-arranging Eq. 26, $$\text{voltage gain} = V_{OUT}/V_{IN} = R_L/2R_S \quad \text{Eq. 27}$$

From Eq. 27, as long as the transconductance of the first input transistor 12 is matched to the transconductance of the first cross-coupled transistor 16, the transconductance of the second input transistor 14 is matched to the transconductance of the second cross-coupled transistor 18, the first source resistor ($R_{1S}$) 20 is essentially equal to the second source resistor ($R_{2S}$) 22, and the first current source ($I_{1BIAS}$) 26 is essentially equal to the second current source ($I_{2BIAS}$) 30, then the voltage gain of the differential transconductance amplifier 10 is determined by passive components, namely the source resistors 20, 22 and the output resistor ($R_L$) 28. Therefore, changes in transistor transconductance as a result of current, voltage, temperature, or other changes will not affect the voltage gain of the differential transconductance amplifier 10. As a result, the differential transconductance amplifier 10 behaves in a linear manner over its entire operating voltage range.

Other embodiments of the present invention may use n-channel metal oxide semiconductor (NMOS) transistors as transconductance elements; however, PMOS transistors may have lower 1/f noise than NMOS transistors in some complimentary metal oxide semiconductor (CMOS) processes. The present invention may be implemented using standard CMOS processes, which provide high input impedances and support high levels of integration with low production costs.

Some differential amplifiers use a larger number of active elements than the present invention, and since each active element adds noise and power, the present invention may exhibit lower noise and power consumption than other differential amplifiers. One technique for reducing 1/f noise in a differential amplifier is to increase the die size of the active elements. Since the present invention uses relatively few active elements, the die size for each active element can be increased with minimal impact on production cost.

One technique for reducing thermal noise in a differential amplifier is to reduce the value of resistive elements. In the differential transconductance amplifier 10 of FIG. 1, the values of $R_L$ and $R_S$ could both be reduced proportionately to reduce thermal noise without affecting amplifier gain; however, low values of $R_S$ could make the differential transconductance amplifier 10 more susceptible to latch-up problems, reduced dynamic range problems, or both.

Transconductance mismatch, threshold voltage mismatch, or both, of transconductance elements can lead to operation in non-linear operating regions when in the presence of large input signals, which can lead to latch-up problems. For example, if a large positive differential input voltage is applied to the differential inputs $V_{1IN}, V_{2IN}$ of the differential transconductance amplifier 10, then the first differential output $V_{1OUT}$ is driven to a large value, which reduces the source-to-drain voltage drops of the first transistors 12, 16. Transconductance mismatch, threshold voltage mismatch, or both, of the transistors 12,14,16,18 can lead to insufficient voltage being available for the source-to-gate of the first transistors 12,16, to function in their linear operating regions, which can lead to latch-up problems. The impact of mismatches is aggravated by low values of $R_S$ due to resulting larger voltage drops across the source-to-drains of the transistors 12,14,16,18.

Figure 2:
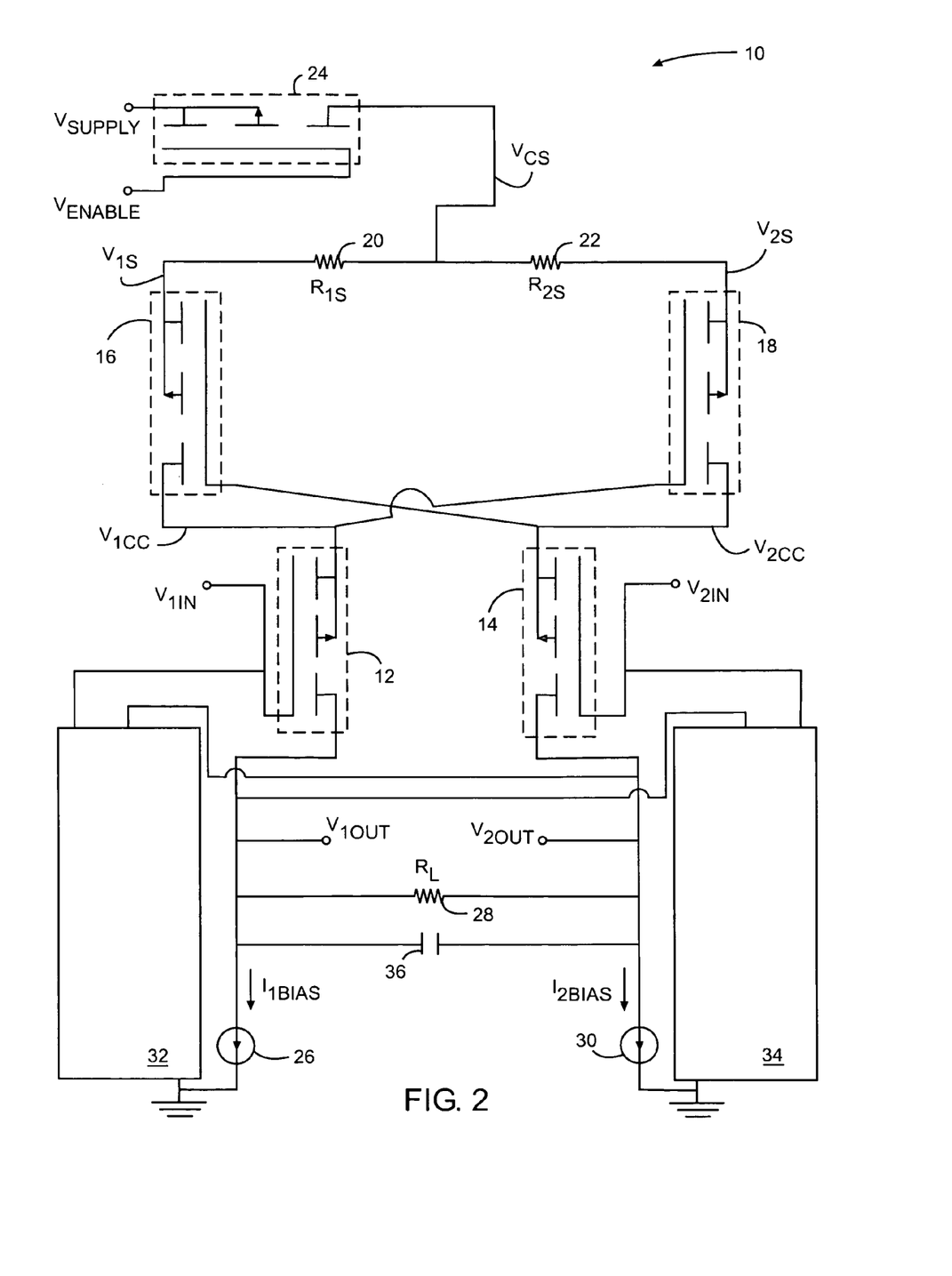
FIG. 2 shows another embodiment of the present invention wherein bootstrap circuits are added to extend the operating range and prevent latch-up of the transconductance elements.

To reduce the effects of transconductance mismatch, threshold voltage mismatch, or both, some embodiments of the present invention use bootstrap circuits to maintain linear operation of the differential transconductance amplifier 10 as shown in FIG. 2. A first bootstrap circuit 32 is coupled to the gate of the first input transistor 12. The first bootstrap circuit 32 is also coupled to the drain of the second input transistor 14 and to ground. When the voltage at the drain of the second input transistor 14 minus the voltage at the gate of the first input transistor 12 exceeds a specified threshold, the first bootstrap circuit 32 conducts current from the drain of the second input transistor 14 to ground to maintain linear operation of the second input transistor 14 and the second cross-coupled transistor 18.

A second bootstrap circuit 34 is coupled to the gate of the second input transistor 14. The second bootstrap circuit 34 is also coupled to the drain of the first input transistor 12 and to ground. When the voltage at the drain of the first input transistor 12 minus the voltage at the gate of the second input transistor 14 exceeds a specified threshold, the second bootstrap circuit 34 conducts current from the drain of the first input transistor 12 to ground to maintain linear operation of the first input transistor 12 and the first cross-coupled transistor 16. The differential transconductance amplifier 10 may also include an output capacitor 36 to provide a frequency roll-off.

Figure 3:
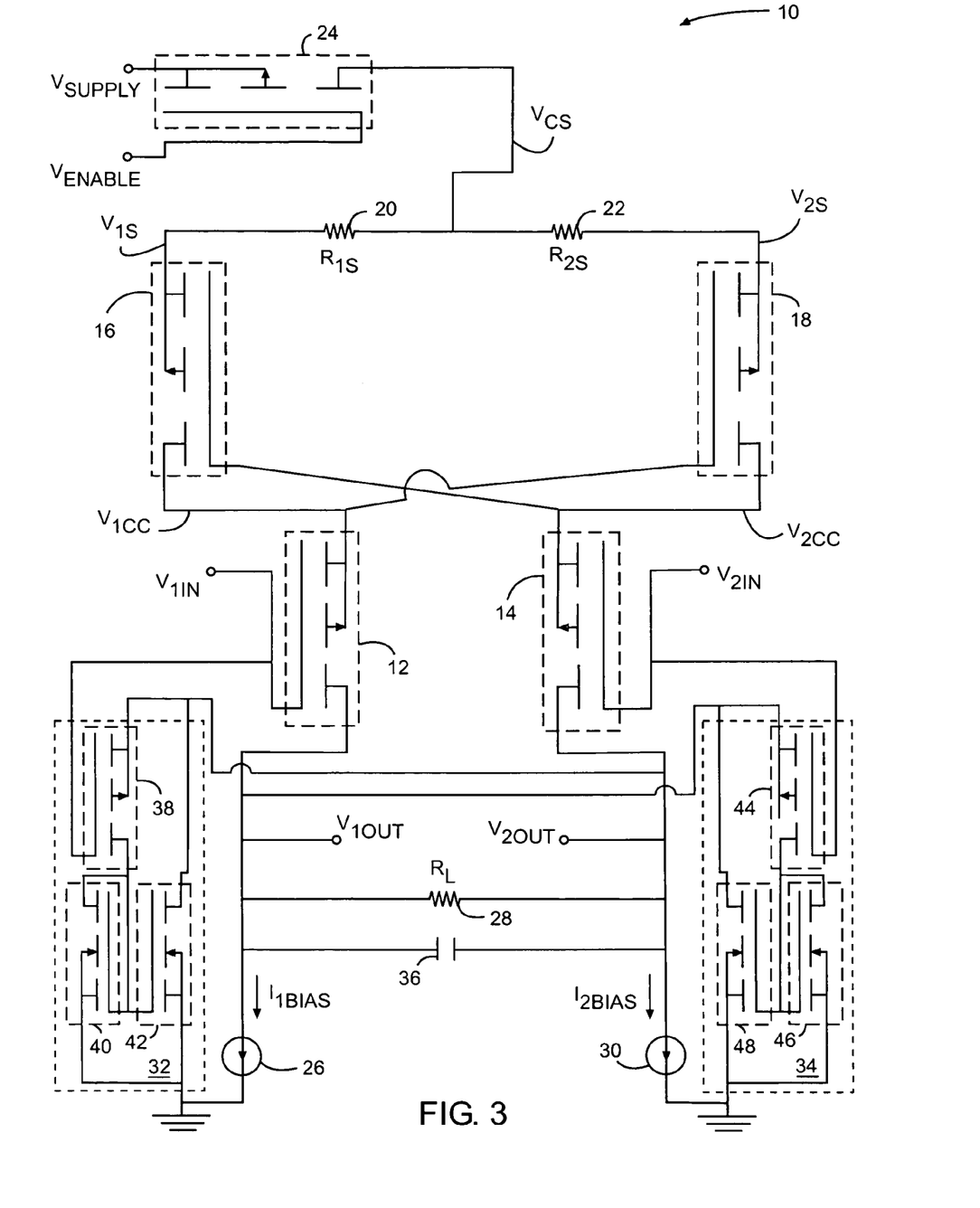
FIG. 3 shows another embodiment of the present invention wherein specific bootstrap circuits are added.

Another embodiment of the present invention includes specific bootstrap circuits 32, 34 as shown in FIG. 3. A first threshold transistor 38, which is a PMOS transistor, is used to sense when the voltage at the drain of the second input transistor 14 minus the voltage at the gate of the first input transistor 12 exceeds a specified threshold. A first reference transistor 40, which is an NMOS transistor, is coupled to the first threshold transistor 38 to provide a reference voltage for a first current mirror transistor 42, which is an NMOS transistor. The first current mirror transistor 42 is sized to conduct sufficient current to maintain linear operation of the second input transistor 14 and the second cross-coupled transistor 18.

A second threshold transistor 44, which is a PMOS transistor, is used to sense when the voltage at the drain of the first input transistor 12 minus the voltage at the gate of the second input transistor 14 exceeds a specified threshold. A second reference transistor 46, which is an NMOS transistor, is coupled to the second threshold transistor 44 to provide a reference voltage for a second current mirror transistor 48, which is an NMOS transistor. The second current mirror transistor 48 is sized to conduct sufficient current to maintain linear operation of the first input transistor 12 and the first cross-coupled transistor 16.

Figure 4:
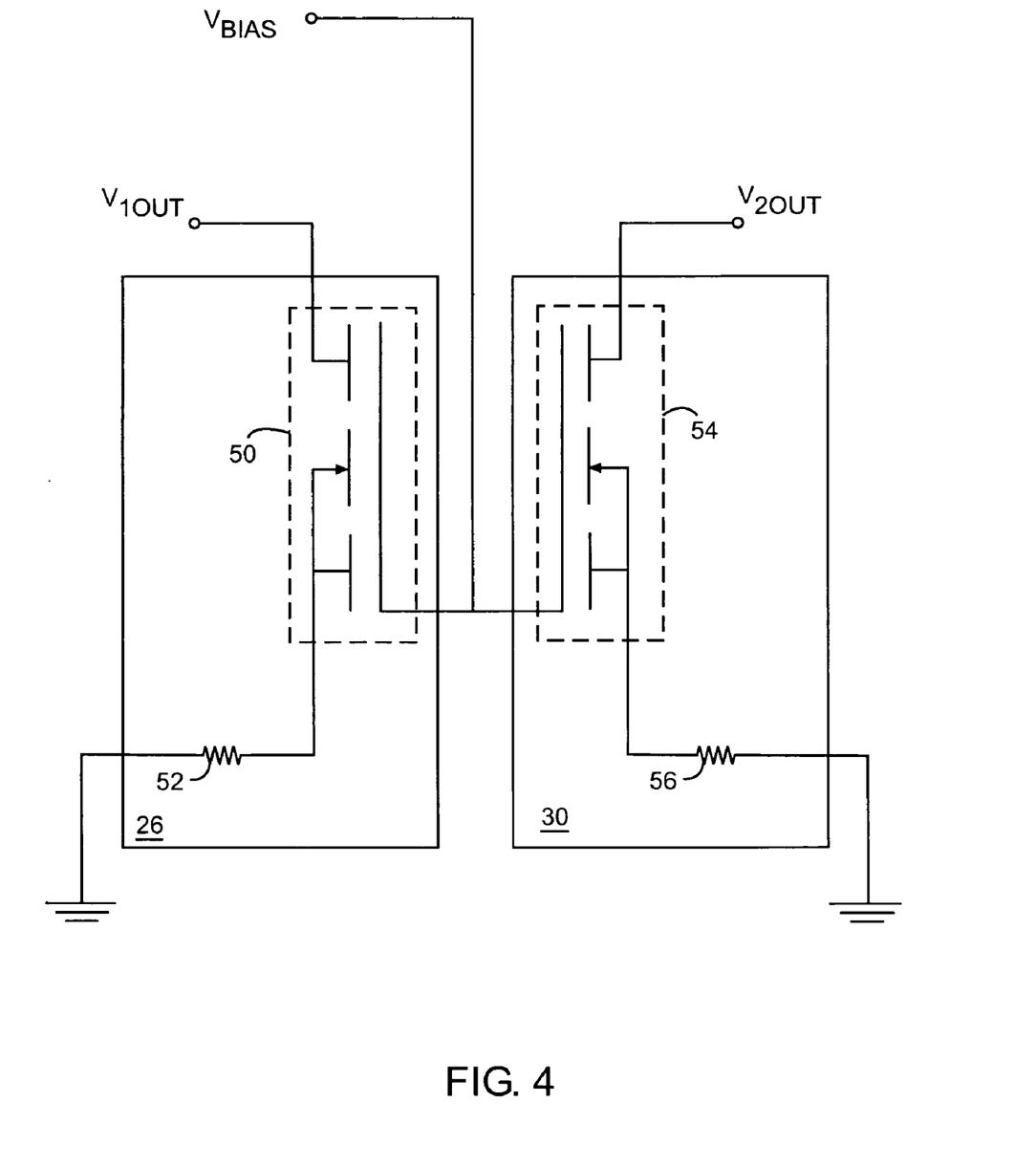
FIG. 4 shows circuit details of the current sources shown in FIG. 1.

FIG. 4 shows circuit details of the current sources 26, 30 shown in FIG. 1. The first current source 26 includes a first current source transistor 50, which is an NMOS transistor. The gate of the first current source transistor 50 is coupled to a bias voltage $V_{BIAS}$. The drain of the first current source transistor 50 is coupled to the first differential output $V_{1OUT}$. The source of the first current source transistor 50 is coupled to a first current source reference resistor 52. The bias voltage $V_{BIAS}$ and the first current source reference resistor 52 establish the operating current of the first current source 26.

The second current source 30 includes a second current source transistor 54, which is an NMOS transistor. The gate of the second current source transistor 54 is coupled to the bias voltage $V_{BIAS}$. The drain of the second current source transistor 54 is coupled to the second differential output $V_{2OUT}$. The source of the second current source transistor 54 is coupled to a second current source reference resistor 56. The bias voltage $V_{BIAS}$ and the second current source reference resistor 56 establish the operating current of the second current source 30.

Figure 5:
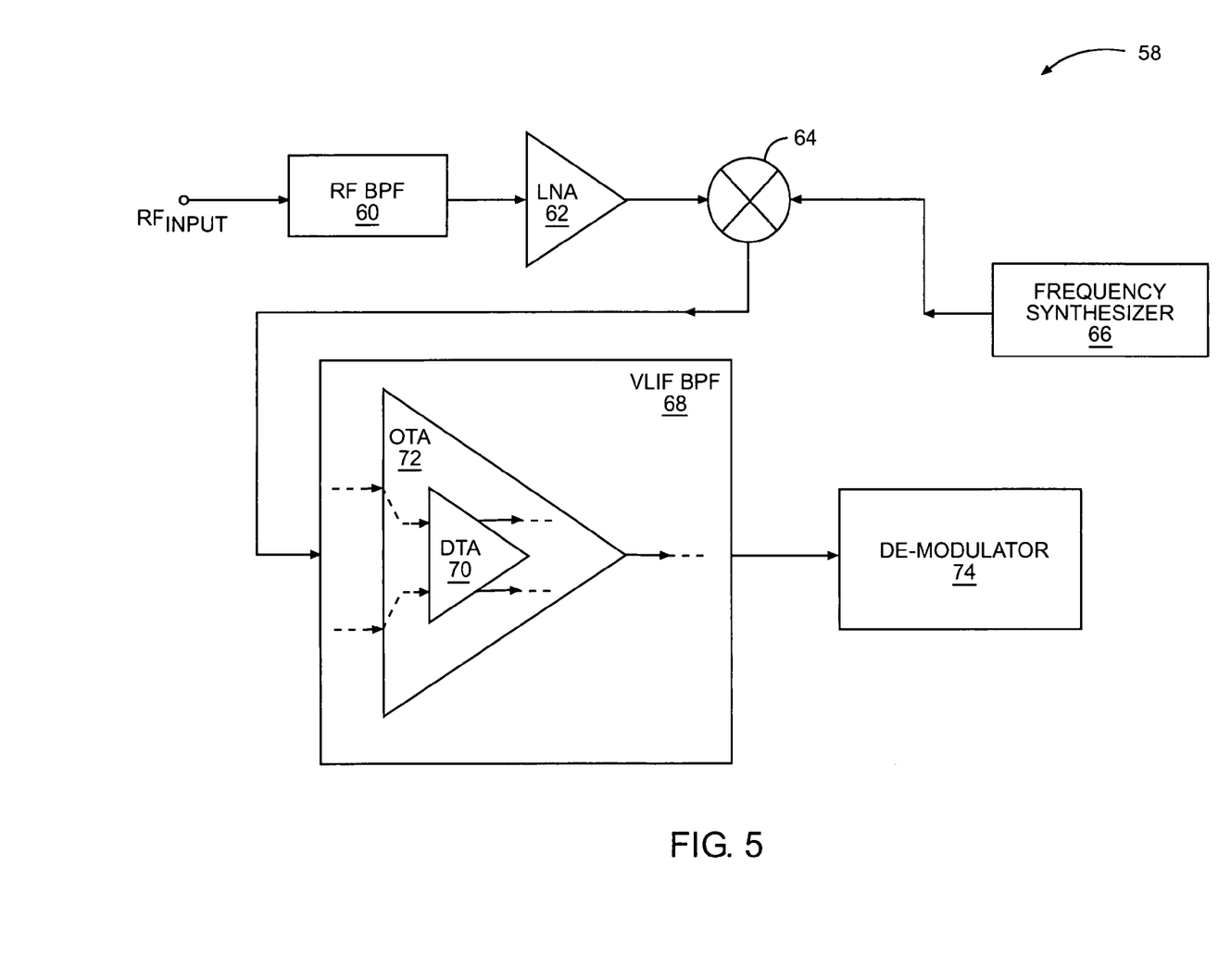
FIG. 5 shows an application example of the present invention used in a filter circuit in a radio frequency (RF) receiver.

An application example of the present invention is its use in an RF receiver 58 as shown in FIG. 5. A received RF signal $RF_{INPUT}$, feeds an RF bandpass filter (RF BPF) 60, which then feeds a low noise amplifier (LNA) 62, followed by an RF mixer 64. The RF mixer 64 receives a reference frequency from a frequency synthesizer 66, which selects the appropriate receive channel, and down converts the received RF signal to a very low intermediate frequency (VLIF). The VLIF signal is fed into an active VLIF bandpass filter (VLIF BPF) 68, which removes interfering signals and the image frequency. Since the magnitude of interfering signals could be large compared to the desired signal, the active components in the VLIF BPF 68 must perform in a linear manner over a very wide operating range. Since the desired signal may be small, the VLIF BPF 68 must be low noise; therefore, the present invention can provide the active components for the VLIF BPF 68. A differential transconductance amplifier (DTA) 70 is used to create an operational transconductance amplifier (OTA) 72, which is used throughout the VLIF BPF 68. The VLIF BPF 68 then feeds a de-modulator 74 to extract the desired baseband signal.

Those skilled in the art will recognize improvements and modifications to the preferred embodiments of the present invention. All such improvements and modifications are considered within the scope of the concepts disclosed herein and the claims that follow.

What is claimed is:

1. A differential amplifier circuit comprising:
   a first input transconductance element comprising:
      a first control input adapted to receive a first input signal;
      a first current input; and
      a first current output adapted to provide a first output signal;
   a second input transconductance element comprising:
      a second control input adapted to receive a second input signal;
      a second current input; and
      a second current output adapted to provide a second output signal;
   a first cross-coupled transconductance element comprising:
      a third control input coupled to the second current input; and
      a third current output coupled to the first current input; and
   a second cross-coupled transconductance element comprising:
      a fourth control input coupled to the first current input; and
      a fourth current output coupled to the second current input,
   wherein the first input signal and the second input signal form a differential input signal, and the first output signal and the second output signal form a differential output signal.

2. The differential amplifier circuit of claim 1 wherein: the first input transconductance element further comprises a first PMOS transistor;
   the second input transconductance element further comprises a second PMOS transistor;
   the first cross-coupled transconductance element further comprises a third PMOS transistor; and
   the second cross-coupled transconductance element further comprises a fourth PMOS transistor.

3. The differential amplifier circuit of claim 1 wherein:
   a the first input transconductance element further comprises a first NMOS transistor;
   the second input transconductance element further comprises a second NMOS transistor;
   the first cross-coupled transconductance element further comprises a third NMOS transistor; and
   a the second cross-coupled transconductance element further comprises a fourth NMOS transistor.

4. The differential amplifier circuit of claim 1 wherein a transconductance of the first input transconductance element is essentially equal to a transconductance of the first cross-coupled transconductance element.

5. The differential amplifier circuit of claim 1 wherein a transconductance of the second input transconductance element is essentially equal to transconductance of the second cross-coupled transconductance element.

6. The differential amplifier circuit of claim 1 wherein a transconductance of the first cross-coupled transconductance element is essentially equal to a transconductance of the second cross-coupled transconductance element.

7. The differential amplifier circuit of claim 1 wherein a threshold voltage of the first input transconductance element is essentially equal to a threshold voltage of the first cross-coupled transconductance element.

8. The differential amplifier circuit of claim 1 wherein a threshold voltage of the second input transconductance element is essentially equal to a threshold voltage of the second cross-coupled transconductance element.

9. The differential amplifier circuit of claim 1 wherein a threshold voltage of the first cross-coupled transconductance element is essentially equal to a threshold voltage of the second cross-coupled transconductance element.

10. The differential amplifier circuit of claim 1 wherein:
   a the first cross-coupled transconductance element further comprises a third current input;
   the second cross-coupled transconductance element further comprises a fourth current input; and
   the differential amplifier circuit further comprises:
      a first source resistive element coupled to the third current input; and
      a second source resistive element coupled to the fourth current input.

11. The differential amplifier circuit of claim 10 wherein the first source resistive element is essentially identical to the second source resistive element.

12. The differential amplifier circuit of claim 1 further comprising a load resistive element coupled between the first current output and the second current output.

13. The differential amplifier circuit of claim 1 further comprising a load capacitive element coupled between the first current output and the second current output.

14. The differential amplifier circuit of claim 1 further comprising:
   a first current source coupled to the first current output; and
   a second current source coupled to the second current output.

15. The differential amplifier circuit of claim 14 wherein the current provided by the first current source is essentially equal to the current provided by the second current source.

16. The differential amplifier circuit of claim 1 further comprising a first bootstrap circuit comprising:
- a first bootstrap input coupled to the first control input; and
- a first bootstrap output coupled to the second current output, such that when a voltage between the first bootstrap input and the first bootstrap output exceeds a first bootstrap threshold voltage, an input impedance of the first bootstrap output is reduced.

17. The differential amplifier circuit of claim 16 wherein the first bootstrap circuit further comprises:
- a bootstrap threshold transistor comprising:
  - a first gate coupled to the first bootstrap input;
  - a first source coupled to the first bootstrap output; and
  - a first drain;
- a bootstrap reference transistor comprising:
  - a second gate coupled to the first drain;
  - a second source; and
  - a second drain coupled to the second gate; and
- a bootstrap current mirror transistor comprising:
  - a third gate coupled to the second gate;
  - a third source coupled to the second source; and
  - a third drain coupled to the first bootstrap output.

18. The differential amplifier circuit of claim 16 further comprising a second bootstrap circuit comprising:
- a second bootstrap input coupled to the second control input; and
- a second bootstrap output coupled to the first current output, such that when a voltage between the second bootstrap input and the second bootstrap output exceeds a second bootstrap threshold voltage, an input impedance of the second bootstrap output is reduced.

19. The differential amplifier circuit of claim 1 further comprising a first bootstrap circuit comprising:
- a first bootstrap input coupled to the second control input; and
- a first bootstrap output coupled to the first current output, such that when a voltage between the first bootstrap input and the first bootstrap output exceeds a first bootstrap threshold voltage, an input impedance of the first bootstrap output is reduced.

20. The differential amplifier circuit of claim 19 wherein the first bootstrap circuit further comprises:
- a bootstrap threshold transistor comprising:
  - a first gate coupled to the first bootstrap input;
  - a first source coupled to the first bootstrap output; and
  - a first drain;
- a bootstrap reference transistor comprising:
  - a second gate coupled to the first drain;
  - a second source; and
  - a second drain coupled to the second gate; and
- a bootstrap current mirror transistor comprising:
  - a third gate coupled to the second gate;
  - a third source coupled to the second source; and
  - a third drain coupled to the first bootstrap output.

\* \* \* \* \*